United States Patent [19]

Bonitz et al.

[11] Patent Number: 4,562,544

[45] Date of Patent: Dec. 31, 1985

[54] CYCLICAL RESET OF VEHICULAR MICROCOMPUTERS FOR ECONOMIC ERROR IMMUNITY

[75] Inventors: Jörg Bonitz, Mühlacker; Robert Entenmann, Benningen; Géza Killi, Stuttgart; Rochus Knab, Kornwestheim; Bernhard Miller, Stuttgart; Siegfried Rohde, Schwieberdingen; Walter Viess, Illingen, all of Fed. Rep. of Germany

[73] Assignee: Robert Bosch GmbH, Stuttgart, Fed. Rep. of Germany

[21] Appl. No.: 507,056

[22] Filed: Jun. 23, 1983

[30] Foreign Application Priority Data

Jun. 28, 1982 [DE] Fed. Rep. of Germany ....... 3224286

[51] Int. Cl.[4] ........................ H03K 5/13; F02D 35/00; F02D 37/02; G05B 15/02

[52] U.S. Cl. ................................ 364/431.11; 123/480; 371/12

[58] Field of Search ....................... 364/431.04, 431.05, 364/431.06, 431.10, 431.11; 123/480, 486, 609, 610; 371/12

[56] References Cited

U.S. PATENT DOCUMENTS

| | | | |
|---|---|---|---|
| 3,969,614 | 7/1976 | Moyer et al. | 364/431.06 |
| 4,140,087 | 2/1979 | Daumer et al. | 123/486 |
| 4,185,603 | 1/1980 | Sohner et al. | 123/609 |
| 4,205,376 | 5/1980 | Yoshida | 364/431.11 |
| 4,250,858 | 2/1981 | Jeenicke et al. | 123/480 |
| 4,282,574 | 8/1981 | Yoshida et al. | 364/431.10 |
| 4,355,360 | 10/1982 | Asano et al. | 364/431.11 |

OTHER PUBLICATIONS

Morris et al.: Scamp Microprocessor Aims to Replace Mechanical Logic, Electronics, Sep. 18, 1975, pp. 81-87.

*Primary Examiner*—Felix D. Gruber

*Attorney, Agent, or Firm*—Frishauf, Holtz, Goodman & Woodward

[57] ABSTRACT

A cyclical input signal for the microcomputer of a motor vehicle is caused to reset the microcomputer for avoiding persistence of errors. Another portion of the same periodic signal can advantageously be furnished to the external interrupt input of the microcomputer.

4 Claims, 1 Drawing Figure

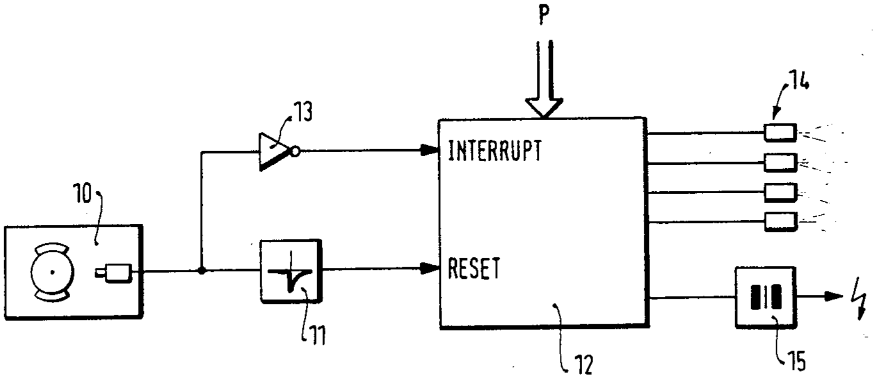
P
14
13
INTERRUPT
10
RESET
11
12
15

CYCLICAL RESET OF VEHICULAR MICROCOMPUTERS FOR ECONOMIC ERROR IMMUNITY

This invention concerns the control of a microcomputer utilized in a motor vehicle to respond to signals produced by various parts of the vehicle equipment.

U.S. Pat. No. 4,250,858 shows such a microcomputer used for control of ignition and fuel injection in internal combustion engines. Other functions, such as the control of on-board calculators, vehicle transmissions and anti-blocking devices of a braking system have also heretofore been controlled by microcomputers. Microcomputers have likewise found application in other areas of application, as for example heating technology and machine tools. These known control systems produce output control signals depending on input signals that are predominantly the outputs of periodic signal generators (for example transducers), with the microcomputer usually being initialized when the supply voltage is switched on and thereby be brought into a defined initial condition. If disturbances occur during operation, expecially as the result of false running of a program or of a sub-program, a so-called watchdog circuit can be provided in a known way, as shown for example in U.S. Pat. No. 4,287,565. Such circuits monitor the periodic running of the program and produce a reset pulse upon recognition of a disturbance. The reset pulse brings the microcomputer back to a defined initial condition. This supplementary circuit for recognizing disturbances involves expense which is by no means small, particularly when the occurrence of errors of an exceedingly broad variety is to be recognized.

SUMMARY OF THE INVENTION

It is an object of the present invention to provide adequate freedom from interference of errors in a vehicular computer without the expense of a watchdog circuit.

Briefly, a generator of periodic input signals for the microcompute which is driven by the engine of a motor vehicle is utilized to provide a reset signal synchronized with engine shaft rotation for starting the microcomputer anew with each cycle of the generator.

The invention has the advantage that no supplementary circuits are necessary, because the periodically reappearing reset pulse forces the microcomputer into the correct program run path with every new period. Thus, without supplementary circuit expense, substantially complete freedom from errors resulting from external disturbing influences is obtained. Any error that occasionally appears is eliminated in the briefest time, since no time is spent waiting for the recognition of the error.

It has been found preferable to interpose a differentiating circuit between the periodic generator signals and the reset input of the microcomputer. A further improvement can be obtained by supplying signals to an interrupt input of the microcomputer at the same rate but offset in time with respect to those supplied to the reset input, and in that connection it is useful to insert an inverter ahead of the interrupt input.

BRIEF DESCRIPTION OF THE DRAWING

The invention is further described by way of illustrative example with reference to the annexed drawing, the single figure of which is a circuit block diagram of an embodiment of the invention.

DESCRIPTION OF THE PREFERRED EMBODIMENT

The signal generator 10 is a rotary transducer of the kind sometimes called a tachogenerator because the signals produced depend upon the rotary speed of an engine. The signal generator 10 can be a Hall-effect or a signal generator operating optically or inductively in response to the revolution of a shaft or of a disk mounted thereon.

The output of the signal generator 10 is connected to a differentiating circuit 11, the output of which is connected to the reset input of a microcomputer 12 and also to an inverter 13, the output of which is connected to the interrupt input of the same microcomputer 12.

In the illustrated case, the microcomputer 12 serves for control of fuel injection and ignition in an internal combustion engine, such control being effected by means of four controllable injection nozzles 14 and an ignition final stage 15. Further details of the control of engine ignition and fuel injection by a microcomputer are unnecessary, since they are well known in the prior art and are illustrated, for example, in previously cited U.S. Pat. No. 4,250,858. The data input to the computer 12 marked P represents the provision of additional parameters, such as, for example, the temperature, the engine intake pressure and other supplementary information serving in a known way to determine the output values provided by the microcomputer 12.

In the system of the present invention, the microcomputer 12 is not started anew or put in a defined condition by the application of the supply voltage or upon recognition of an error, but it is reset instead by every output signal of the signal generator 10. In that way, by resetting the address counter in the microcomputer 12, a defined program start is made possible every time. A simultaneous erasing of the stack pointer in the microcomputer prevents or removes occasional errors in subprogram processing. All parameters (memory bank selection, interrupt processing, flag, counters) and all ports are newly defined by this continually reappearing reset pulse and can thus be brought back into desired positions.

One flank of the input signal is converted into a short pulse by the differentiating circuit 11, and that short pulse resets the microcomputer 12 at the beginning of every new signal of the signal generator, which in the illustrated case produces a prolonged signal. In consequence, the prescribed program course proceeds anew from fixedly predetermined initial conditions. The other flank of the signal from the signal generator is inverted by the inverter 13 and supplied to the external interrupt input of the microcomputer 12. According to the desired or prescribed polarity of the interrupt signal, tne inverter 13 may in some cases be omitted. On the basis of its program, there will be produced in the microcomputer 12, in a known way, a count value that depends on the operation parameters communicated to the microcomputer, after which that value will be counted out for obtaining an event-initiating pulse at the output of the microcomputer. This counting out advantageously takes place in the illustrated case beginning with the interrupt pulse, therefore beginning with the occurrence of the second signal flank of the output signal of the signal generator 10. In the case of ignition, such a counting-out procedure serves for example for determining the instant at which the current flow begins and the moment at which the current flow ends (ignition instant) in an ignition coil. If the rotary speed indicated in dependence on the input signal generator signals lies below some prescribed value, a switchover of the output circuit can be provided in a known way from the normal output pulse of the microcomputer to an auxiliary pulse as the result of the two signal flanks of the output signal of the signal generator 10.

In most cases, the reset pulse will be derived either from a speed signal generator or an angle of rotation signal generator like the signal generator 10 of the drawing, or else from a reference mark signal from a signal generator that produces a short pulse once per revolution of an engine shaft. In principle, other frequent and regularly occurring signals are likewise usable for reset control.

It is essential to the invention that one source of signals furnishing data input to the microcomputer should have a rotary component and an electrical output, so as to produce a sequence of repetitive signals at a repetition rate not less than the rate of revolution of said rotary component, since the use of much repetitive signals for resetting the microcomputer will then assure resetting at intervals sufficiently short for adequate immunity to errors and sufficiently long for the data processing usually desired in a vehicular system. In the illustrated case, with the signal source 10 having a rotary body of the contour shown in the drawing (a "segment" type rotor for an inductive generator) resetting of the microcomputer occurs twice for every revolution of the rotor.

We claim:

1. In a system comprising a microcomputer for controlling engine-speed-dependent operation of equipment of an internal combustion engine, of a motor vehicle, in response to operation conditions of said engine represented by electrical signals, said signals including at least one sequence of repetitive signals having a repetition rate not less than and synchronizing with the rate of revolution of a rotary body continuously dirven by said engine, said repetitive signals of said sequence being generated by a signal source having a rotary component body and an electrical output connection, and said microcomputer having a reset input for putting said microcomputer into a predetermined state suitable for beginning a computer operation, the improvement comprising:

means for providing, by an electrical circuit connected to said signal source output connection, a reset signal to said reset input of said mircrocomputer in response to each of said repetitive signals of said sequence, whereby the vulnerability by error of said system for controlling equipment of said engine is limited, for each error, to a duration not exceeding one revolution of said rotary component of said signal source.

2. Improvement in a system according to claim 1, in which said electrical circuit includes a differentiating electrical circuit interposed between said signal source and said microcomputer reset input for providing a pluse of a predetermined polarity in response to a rapid change of potential, in a predetermined direction of change, at the output connection of said signal source.

3. Improvement in a system according to claim 1, in which said microcomputer has an external interrupt input and in which means are also provided for supplying a signal to said interrupt input of said microcomputer at the same repetition rate as the signals provided to said reset input but offset in time therefrom, by a second electric circuit interconnecting said output connection of said signal source and said interrupt input of said microcomputer.

4. Improvement in a system in accordance with claim 3, in which said second electric circuit includes an inverter stage interposed between said signal source and said interrupt input.

* * * * *